United States Patent [19]
Yogore

[11] 3,983,421
[45] Sept. 28, 1976

[54] REMOTE AUDIO ATTENUATOR

[75] Inventor: Mario G. Yogore, Rosemead, Calif.

[73] Assignee: The Raymond Lee Organization, Inc., New York, N.Y. ; a part interest

[22] Filed: Jan. 24, 1975

[21] Appl. No.: 543,819

[52] U.S. Cl. .............................. 307/311; 307/253; 307/308; 328/208
[51] Int. Cl.² ........................................ H03K 3/42
[58] Field of Search ............... 307/311, 308; 328/2, 328/208; 330/59; 323/75 H, 75 N; 324/DIG. 1

[56] References Cited
UNITED STATES PATENTS

| | | | |
|---|---|---|---|
| 3,072,795 | 1/1963 | Badmaieff | 330/59 X |
| 3,315,153 | 4/1967 | Whatley | 323/75 A |
| 3,436,671 | 4/1968 | Fenton et al. | 330/59 |
| 3,596,198 | 7/1971 | Niki | 330/59 |
| 3,732,443 | 5/1973 | Lovrenich | 324/DIG. 1 |

Primary Examiner—Stanley D. Miller, Jr.
Assistant Examiner—B. P. Davis
Attorney, Agent, or Firm—Howard I. Podell

[57] ABSTRACT

A remote audio attenuator in which a volume control variable resistor of the attenuator regulates a volume control variable resistor of a distant audio system with complete isolation between the circuit of the two volume control resistors, and with rapid response between the two control units. The attenuator employs a lamp controlled by a differential operational amplifier, with the lamp set to equally illuminate slave photoresistors, one or more of which serve as the volume control units of the distant audio system, and one of which is connected to a resistance bridge to provide feedback to the differential operational amplifier, the output of which is also controlled by the remote control variable resistor which is also connected to the resistance bridge.

2 Claims, 1 Drawing Figure

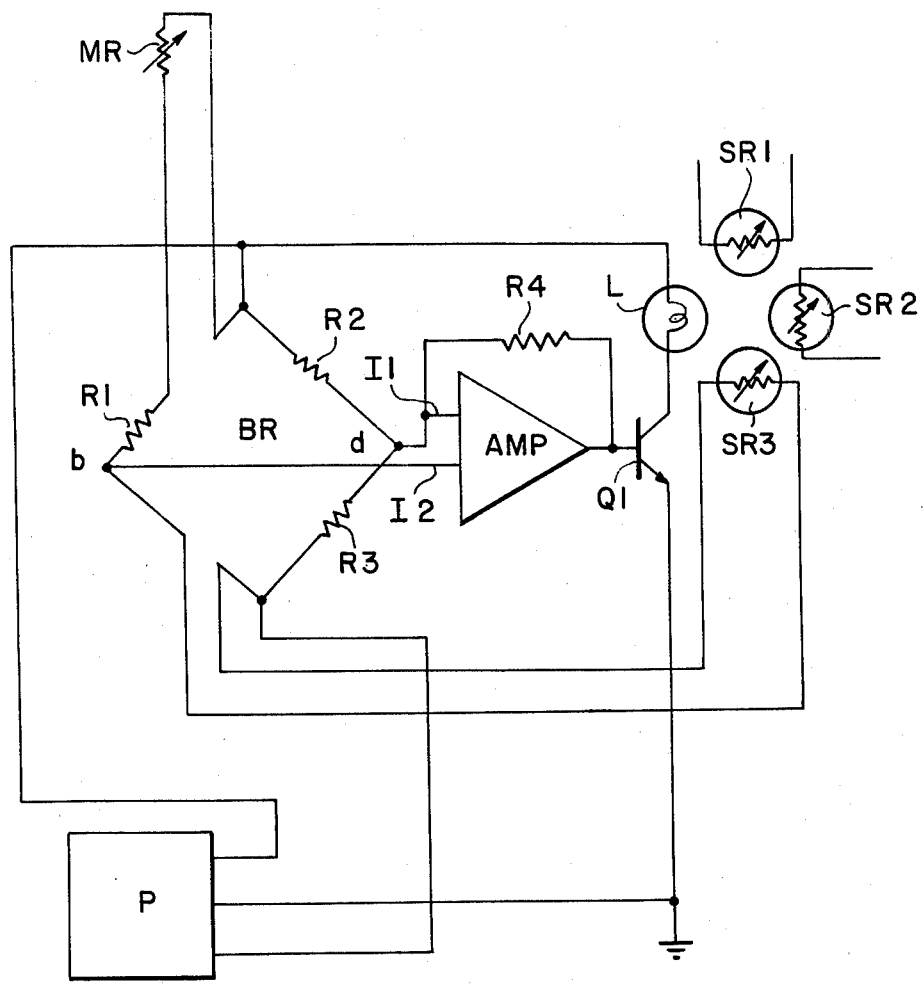

REMOTE AUDIO ATTENUATOR

SUMMARY OF THE INVENTION

My invention is a remote audio attenuator in which a volume control variable resistor of the attenuator regulates a volume control variable resistor of a distant audio system with complete isolation between the circuit of the two volume control resistors, and with rapid response between the two control units.

The attenuator employs a lamp controlled by a differential operational amplifier, with the lamp set to equally illuminate slave photoresistors, one or more of which serve as the volume control units of the distant audio system, and one of which is connected to a resistance bridge to provide feedback to the differential operational amplifier, the output of which is also controlled by the remote control variable resistor which is also connected to the resistance bridge.

BRIEF DESCRIPTION OF THE DRAWINGS

The objects and features of the invention may be understood with reference to the following detailed description of an illustrative embodiment of the invention, taken together with the accompanying drawing in which the FIGURE is a schematic diagram of the circuitry of the remote control attenuator.

DESCRIPTION OF THE PREFERRED EMBODIMENT

Turning now descriptively to the drawings, in which similar reference characters denote similar elements throughout the several views, the FIGURE illustrates the circuitry of the invention. A remote located variable Master Resistor MR controls the resistance of Slave variable Photo Resistors $SR_1$, $SR_2$ and $SR_3$, with Slave Resistors $SR_1$ and $SR_2$ connected to the circuitry of the electronic system to be remotely controlled at a distance by the Master Resistor MR. Slave Resistors $SR_1$, $SR_2$ and $SR_3$ are photoresistors of the same type with closely matched characteristics and are located so as to equally share light cast by lamp L, which is in series with transistor $Q_1$ and power supply P. The resistance of the Slave Resistors is inversely proportional to the amount of light each receives from lamp L.

High gain differential operational amplifier AMP is powered by an independent power supply (not indicated) and connected to control the output of transistor $Q_1$, with amplifier AMP controlled directly by input $l_2$ and inversely by input $l_1$, connected to opposite nodes $b$ and $d$ of resistance bridge BR. The input impedance of amplifier AMP is very high relative to each of the resistors $R_1$, $R_2$, $R_3$, MR and $SR_3$ of the bridge BR. Resistances $R_2$ and $R_3$ are of equal fixed values and the bridge circuit is balanced when the resistance of Master Resistor MR equals the resistance of photoresistor $SR_3$, producing no voltage across the input terminals $I_1$ and $I_2$ of amplifier AMP in the balanced condition. Resistor $R_1$ is set for a value slightly larger than the resistance of photoresistor $SR_3$ when the lamp L is at miximum brightness. Resistor $R_4$ is located across the output and the inverse input (−) of Amplifier AMP.

In operation, manually actuating Resistance MR to reduce its resistance causes input $I_2$ to apply a positive voltage to Input $I_2$ of the amplifier AMP resulting in a positive voltage applied to transistor $Q_1$ to cause more current to be supplied to lamp L. Increased brightness of lamp L reduces equally the resistance of Slave Photoresistors $SR_1$, $SR_2$ and $SR_3$, with the reduced resistance of slave photoresistor $SR_3$ acting to balance bridge BR and reduce the output to amplifier AMP when the resistance of $SR_3$ again equals the value of the sums of resistances $R_1$ and MR. Increase of resistance of Master Resistor MR acts in the same manner to increase the values Slave Resistors $SR_1$ and $SR_2$ of the controlled equipment.

The feedback loop circuit of $SR_3$ thus eliminates drift and increases the speed of response of the remote control.

Such obvious changes may be made in the specific embodiment of the invention described herein, such modifications being within the spirit and scope of the invention claimed, it is indicated that all matter contained herein is intended as illustrative and not as limiting in scope.

Having thus described the invention, what I claim as new and desire to secure by Letters Patent of the United States is:

1. An electronic control circuit for the remote regulation of a first photo-resistor which is otherwise electrically isolated from the said control circuit, said control circuit fitted with feed back means to compensate for drift of the said first photo-resistor, comprising an electronic control circuit incorporating an amplifier, the input of which is regulated by a resistance bridge, and the output of which is connected to a light source in the form of an electric light, said resistance bridge fitted with a variable control resistor in a first arm of the bridge and a second photo-resistor in a second arm of the bridge, said first and second photo-resistors being of matched characteristics and physically located to be illuminated by the said electric light, said first and second arms of the resistance bridge being joined to resistors connected as the third and fourth arms of the resistance bridge such that the output of the connected amplifier is constant when the resistance of the said first arm is in a constant fixed ratio to the resistance of the said second arm of the resistance bridge, with a change of the resistance of the said second arm causing the amplifier to vary its output signal to the connected electric light to alter the illumination of said light and to consequently alter the resistance of the second photo-resistor so as to cancel said change of resistance such that the resistance of the first photo-resistor remains in the said constant fixed ratio to the resistance of the said variable control resistor of the said first bridge arm, despite any common drift of resistance value in each of the matched photo-resistors with respect to a constant output of light from the electric light.

2. The combination as recited in claim 1 in which additional photo-resistors are located to receive light from the light source, said additional photo-resistors each connected to circuits to be also controlled by the variable control resistor, said circuits being otherwise electrically isolated from each other and from the said control circuit.

* * * * *